(12) United States Patent
Oh et al.

(10) Patent No.: US 10,403,705 B2
(45) Date of Patent: Sep. 3, 2019

(54) ORGANIC LIGHT EMITTING DISPLAY DEVICE AND METHOD FOR MANUFACTURING THE SAME

(71) Applicant: LG Display Co., Ltd., Seoul (KR)

(72) Inventors: Kum-Mi Oh, Seoul (KR); Hye-Seon Eom, Seo-gu (KR); Shun-Young Yang, Bucheon-si (KR); Jeoung-In Lee, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/128,669

(22) Filed: Sep. 12, 2018

(65) Prior Publication Data

US 2019/0013380 A1    Jan. 10, 2019

Related U.S. Application Data

(62) Division of application No. 15/247,414, filed on Aug. 25, 2016, now Pat. No. 10,103,213.

(30) Foreign Application Priority Data

Aug. 26, 2015 (KR) .......................... 10-2015-0120071

(51) Int. Cl.
*H01L 27/32* (2006.01)
*H01L 51/56* (2006.01)
*H01L 27/12* (2006.01)

(52) U.S. Cl.
CPC ...... *H01L 27/3276* (2013.01); *H01L 27/1251* (2013.01); *H01L 27/1255* (2013.01); *H01L 27/3246* (2013.01); *H01L 27/3262* (2013.01); *H01L 27/3265* (2013.01); *H01L 51/56* (2013.01); *H01L 2227/323* (2013.01)

(58) Field of Classification Search
CPC ............. H01L 27/3276; H01L 27/3246; H01L 27/3265; H01L 27/3262
See application file for complete search history.

(56) References Cited

U.S. PATENT DOCUMENTS 9,129,923 B1    9/2015  Han et al.
2007/0085847 A1  4/2007  Shishido

FOREIGN PATENT DOCUMENTS

CN    10327664 A    8/2013
CN    105097867 A   11/2015

*Primary Examiner* — Douglas M Menz
(74) *Attorney, Agent, or Firm* — Dentons US LLP

(57) ABSTRACT

Disclosed are an organic light emitting display device capable of achieving an intra-pixel integration design with sufficient storage capacitance and a method for manufacturing the same in which the organic light emitting display device includes a first active layer connected to the driving gate electrode and the data line while crossing the gate line, and a second active layer spaced apart from the first active layer while overlapping the driving gate electrode and being connected to the current drive line and storage electrode.

3 Claims, 12 Drawing Sheets

ORGANIC LIGHT EMITTING DISPLAY DEVICE AND METHOD FOR MANUFACTURING THE SAME

This application is a Divisional of application Ser. No. 15/247,414 filed on Aug. 25, 2016, which claims the benefit of Korean Patent Application No. 10-2015-0120071 filed on Aug. 26, 2015, the disclosures of which are hereby incorporated by reference as if fully set forth herein.

BACKGROUND OF THE INVENTION

Field of the Invention

The present invention relates to an organic light emitting display device, and more particularly to an organic light emitting display device capable of achieving an intra-pixel integration design with sufficient storage capacitance and a method of manufacturing the same.

Discussion of the Related Art

With the recent development of various portable electronic appliances such as mobile communication terminals and notebook computers, demand for flat panel display devices applicable to portable electronic appliances is increasing.

Examples of flat panel display devices being currently researched include a liquid crystal display device, a plasma display device, a field emission display device, and an organic or inorganic light emitting diode display device. In particular, in the case of the organic light emitting display device, the application field thereof is being expanded by virtue of its various advantages such as advanced technologies for mass production, easy implementation of driving means, low power consumption, high picture quality, realization of a large screen, and flexibility.

Such an organic light emitting device includes an organic light emitting diode in each pixel for light emission and a pixel circuit for controlling current flowing through the organic light emitting diode. The pixel circuit typically includes at least two thin film transistors, and a storage capacitor.

Meanwhile, thin film transistors are classified into a thin film transistor having a top gate structure and a thin film transistor having a bottom gate structure.

For formation of thin film transistors (TFTs) having a top gate structure, an amorphous silicon layer is first formed over a substrate. The amorphous silicon layer is then crystallized using an excimer layer and, as such, is formed into a polysilicon layer. A photoresist film (not shown) is subsequently coated over the crystallized polysilicon layer. The photoresist film is subjected to a light exposure and development to form a photoresist film pattern. Using the photoresist film pattern as a mask, the polysilicon layer is then etched, to leave an active layer in regions each corresponding to a desired portion of each pixel. A gate insulating film is then formed to cover the active layer. Gate electrodes are finally formed on the gate insulating film, to correspond to the active layer.

On the other hand, formation of TFTs having a bottom gate structure is carried out in such a manner that formation of an active layer and gate electrodes is reverse to that of the TFTs having a top gate structure. Meanwhile, the crystallization process for crystallizing amorphous silicon into polysilicon is carried out at a temperature of 400° C. or more and, as such, disconnection of the active layer may occur during the crystallization process in the bottom gate structure. For this reason, recently developed organic light emitting display devices prefer TFTs having a top gate structure in which gate electrodes are formed after completion of crystallization, in order to eliminate the problem of active layer disconnection.

Hereinafter, one pixel of a conventional organic light emitting display device including TFTs having a top gate structure will be described with reference to the accompanying drawings.

FIG. 1 is a circuit diagram illustrating one pixel of a conventional organic light emitting display device. FIG. 2 is a cross-sectional view taken along a line passing through a drive transistor and a switching TFT, which are illustrated in FIG. 1.

FIG. 1 illustrates a configuration of a pixel circuit in an organic light emitting display device having a basic structure. The pixel circuit includes a switching TFT ST, a drive TFT DT connected to the switching TFT ST, and an organic light emitting diode OLED connected to the drive TFT DT.

The switching TFT ST is formed at a region where a gate line GL and a data line DL cross each other. The switching TFT ST functions to select a pixel. As illustrated in FIG. 2, the switching TFT ST includes a switching gate electrode SG 10 protruding from the gate line GL, a switching source electrode SS branched from the data line DL, a switching drain electrode SD 45, and a first active layer 60 having a switching channel region.

In this case, the switching channel region, which is designated by reference numeral 60a, is defined by a portion of the first active layer 60 overlapping the switching gate electrode SG. Portions of the first active layer 60 disposed at opposite sides of the switching channel region 60a are doped with impurity ions and, as such, function as a source region 60b and a drain region 60c, respectively. The source region 60b and drain region 60c are connected to the switching source electrode SS and switching drain electrode SD of the switching TFT ST, respectively.

Meanwhile, the drive TFT DT functions to drive the organic light emitting diode OLED of the pixel selected by the switching TFT ST. The drive TFT DT includes a driving gate electrode DG 15 connected to the switching drain electrode SD of the switching TFT ST, a drive source electrode DS included in a reference voltage line RL, a driving electrode pattern DD 55 spaced apart from the drive source electrode DS, and a second active layer 70 having a driving channel region 70a and source and drain regions 70b and 70c respectively connected to the drive source electrode DS and driving electrode pattern DD 55 around the driving channel region 70a. The driving electrode pattern DD of the drive TFT DT is connected to a first electrode of the organic light emitting diode OLED.

The driving gatedriving gate electrode DG 15 is arranged over the switching TFT ST and beneath the drive TFT DT while overlapping the switching drain electrode 45 and driving electrode pattern, respectively. Electrical connection is provided at overlapping portions of the driving gate electrode DG 15 and switching drain electrode 45 and, as such, the drain electrode of the switching TFT ST and the gate electrode of the drive TFT DT are connected.

In addition, a storage capacitor Cst may be defined by the overlapping portions of the driving gate electrode DG 15 and driving electrode pattern 55 of the drive TFT DT.

In the conventional organic light emitting display device, the switching drain electrode SD and driving gate electrode DG, which are formed to have a straight shape on a planar surface, overlap each other on the planar surface for a connection between the drain electrode of the switching TFT and the gate electrode of the drive TFT. The switching drain electrode SD and the driving gate electrode DG have an elongated planar straight electrode shape. In this case, the driving electrode pattern DD 55 used as one electrode of the storage capacitor Cst is beneficially not be connected to the driving gate electrode DG 15 even though the driving electrode pattern DD 55 overlaps the driving gate electrode DG 15 when viewed in plan. Accordingly, at least the driving gate electrode DG 15 and the connection portions of the second active layer 70 and driving electrode pattern 55 are spaced apart from each other when viewed in plane. Since the driving gate electrode DG 15 maintains a planar spacing from the connection portions of the second active layer 70 and driving electrode pattern DD 55, the overlap area between the driving electrode pattern DD 55 and the driving gate electrode DG 15 is small. As a result, the storage capacitance determined by the overlap area may be insufficient.

Meanwhile, development of organic light emitting display devices is being accelerated to satisfy demand for large area and high density displays in accordance with gradual expansion of application fields thereof. In particular, as resolution increases, the size of the unit pixel is decreased. The decrease in unit pixel size means that the space of the unit pixel where TFTs and a storage capacitor are arranged is reduced. In the above-mentioned conventional organic light emitting display device, the pixel size may need to be increased to secure a sufficient storage capacitor area. For this reason, it may be difficult to simultaneously secure both high resolution and sufficient capacity of a storage capacitor.

Meanwhile, the organic light emitting diode OLED is formed through a lamination of a first electrode connected to the drain electrode DD 55 of the drive TFT DT, organic layers including an organic light emitting layer, and a second electrode.

In addition, the inter-pixel position of the organic light emitting diode may vary in accordance with light emission types. For example, in a top emission type, the organic light emitting diode can emit light at the top side thereof, irrespective of overlap thereof with a pixel circuit including light-shielding metal wirings. In a bottom emission type, however, the light-shielding metal wirings may shield emission of light and, as such, the aperture ratio of the organic light emitting diode may be reduced as the area of the pixel circuit increases.

In the above-mentioned conventional organic light emitting display device having a top gate structure, the switching drain electrode and driving gate electrode, which are connected in one direction, are beneficially arranged between the active layers of the switching TFT and drive TFT spaced apart from each other when viewed in plane. For this reason, it may be difficult to achieve a desired intra-pixel circuit integration. Accordingly, the conventional organic light emitting display device having a top gate structure may need to secure a space between intra-pixel circuit regions, which makes it difficult to secure high resolution.

In addition, due to the features of the top gate structure, the gate electrode layer occupying a relatively small area in the pixel area is arranged over the active layer and, as such, it may be difficult to secure an area for a storage capacitor. That is, it may be difficult to secure an area overlapping the gate metal layer having a small area for the storage capacitor to have sufficient capacity.

SUMMARY

Accordingly, the present invention is directed to an organic light emitting display device and a method for manufacturing the same that substantially obviate one or more problems due to limitations and disadvantages of the related art.

An advantage of the present invention is to provide an organic light emitting display device capable of achieving an intra-pixel integration design with sufficient storage capacitance.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic light emitting display device may, for example, include a gate line and a data line crossing each other on a substrate, a sensing line extending in parallel to the gate line, and a current driving line and a reference voltage line extending in parallel to the data line, a storage capacitor provided by an overlap between a storage electrode and a driving gate electrode, wherein the storage electrode and the driving gate electrode are disposed on different layers, respectively, a first active layer crossing the gate line, wherein opposite ends of the first active layer connected to the driving gate electrode and the data line and a second active layer spaced apart from the first active layer while overlapping the driving gate electrode, wherein the second active layer protruding from the driving gate electrode has opposite side portions respectively connected to the current drive line and the storage electrode.

The second active layer may extend from the portion connected to the storage electrode such that the second active layer is connected to the reference voltage line while crossing the sensing line.

The first and second active layers may be arranged on the same layer, the driving gate electrode is arranged beneath the first and second active layer and the storage electrode is arranged beneath the driving gate electrode.

The organic light emitting display device may further comprise a switching electrode pattern arranged over the first active layer in a region where the first active layer and the driving gate electrode overlap each other.

And, the switching electrode pattern may penetrate through one end of the first active layer such that the switching electrode pattern is connected to an upper surface of the driving gate electrode while being laterally connected to the first active layer. Also, first active layer has a first switching channel region at a portion thereof overlapping the gate line and a first switching thin film transistor is defined by the gate line, the first active layer, the switching electrode pattern laterally connected to one end of the first active layer, and the data line connected to the other end of the first active layer.

Furthermore, the organic light emitting display device may further comprise a driving electrode pattern arranged over the second active layer, wherein the driving electrode pattern does not overlap with the driving gate electrode while overlapping the storage electrode.

Furthermore, the driving electrode pattern penetrates through the second active layer, wherein the driving electrode pattern is connected to an upper surface of the storage electrode is laterally connected to the second active layer, the second active layer has a driving channel region at a portion thereof overlapping the driving gate electrode; and a drive thin film transistor is defined by the driving gate electrode, the second active layer, the current driving line connected to the second active layer, and the driving electrode pattern.

The organic light emitting display device may further comprise an auxiliary driving gate electrode connected to the switching electrode pattern while overlapping the driving gate electrode.

And, the gate line and the sensing line may be arranged over the first active layer and the second active layer, respectively and the data line, the reference voltage line and the current driving line may be arranged over the gate line and the sensing line.

The auxiliary driving gate line may be arranged at the same layer as the gate line while partially overlapping the second active layer.

Further, the lateral connection between the switching electrode pattern and the first active layer may be provided in a doped region of the first active layer and the lateral connection between the driving electrode pattern and the second active layer may be provided in a doped region of the second active layer.

The organic light emitting display device further comprises a bank for defining a light emission area and an organic light emitting diode comprising a first electrode connected to the driving electrode pattern, a light emitting layer arranged in the light emission area, and a second electrode arranged on the light emitting layer.

Meanwhile, the light emission area may completely overlap the storage capacitor.

Also, an organic light emitting display device according to a different embodiment may, for example, include a substrate having a plurality of pixels in a matrix, a storage electrode at each of the pixels on the substrate, a driving gate electrode over the storage electrode via a first interlayer insulating film wherein the driving gate electrode overlaps the storage electrode, to define a storage capacitor, first and second active layers over the driving gate electrode via a gate insulating film, wherein the first and second active layers are spaced apart from each other while overlapping the driving gate electrode and the storage electrode, respectively, a gate line and a sensing line over the first active layer via a second gate insulating film extending in parallel, to cross the first and second active layers, a data line, a current driving line and a reference voltage line extending in a direction crossing the gate line, arranged over the gate line and the sensing line via a second interlayer insulating film while, wherein the data line is connected to one end of the first active layer, the current driving line and the reference voltage line are connected to opposite ends of the second active layer, respectively and a switching electrode pattern and a driving electrode pattern arranged on a second interlayer insulating film, wherein the switching electrode pattern and the driving electrode pattern are disposed on the same layer as the data line, the switching electrode pattern is connected to the other end of the first active layer, and the driving electrode pattern is connected to a portion of the storage electrode protruding from the driving gate electrode.

In this case, the organic light emitting display device further comprise an auxiliary driving gate electrode arranged on the second gate insulating film overlapping the driving gate electrode, wherein the auxiliary driving gate electrode is connected to the switching electrode pattern.

Furthermore, a method for manufacturing an organic light emitting display device may, for example, include preparing a substrate having a plurality of pixels in a matrix, forming a storage electrode at each of the pixels on the substrate, forming a driving gate electrode over the storage electrode via a first interlayer insulating film such that the driving gate electrode overlaps the storage electrode, to define a storage capacitor, forming first and second active layers over the driving gate electrode via a gate insulating film such that the first and second active layers are spaced apart from each other while overlapping the driving gate electrode and the storage electrode, respectively, forming a gate line and a sensing line over the first active layer via a second gate insulating film such that the gate line and the sensing line extend in parallel, to cross the first and second active layers and forming a data line, a current driving line and a reference voltage line over the gate line and the sensing line via a second interlayer insulating film such that the data line, the current driving line and the reference voltage line extend in a direction crossing the gate line, the data line is connected to one end of the first active layer, and the current driving line and the reference voltage line are connected to opposite ends of the second active layer, respectively, and forming a switching electrode pattern and a driving electrode pattern in the same layer as the data line on a second interlayer insulating film, wherein the switching electrode pattern is connected to the other end of the first active layer, and the driving electrode pattern is connected to a portion of the storage electrode protruding from the driving gate electrode.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and along with the description serve to explain the principle of the invention. In the drawings.

DETAILED DESCRIPTION OF THE ILLUSTRATED EMBODIMENTS

Figure 1:
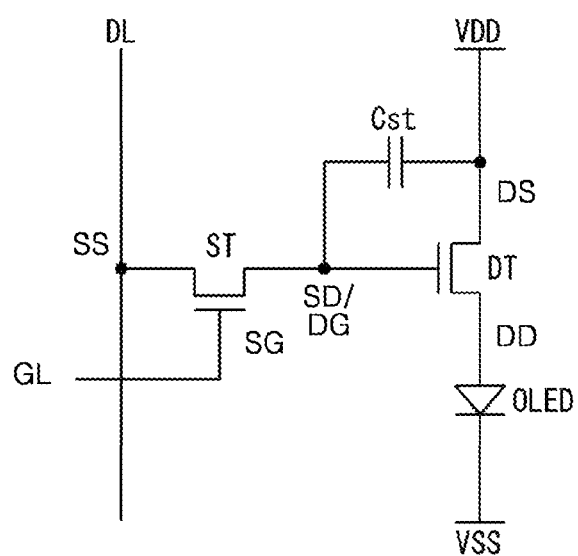
FIG. 1 is a circuit diagram illustrating one pixel of a conventional organic light emitting display device.
Figure 2:
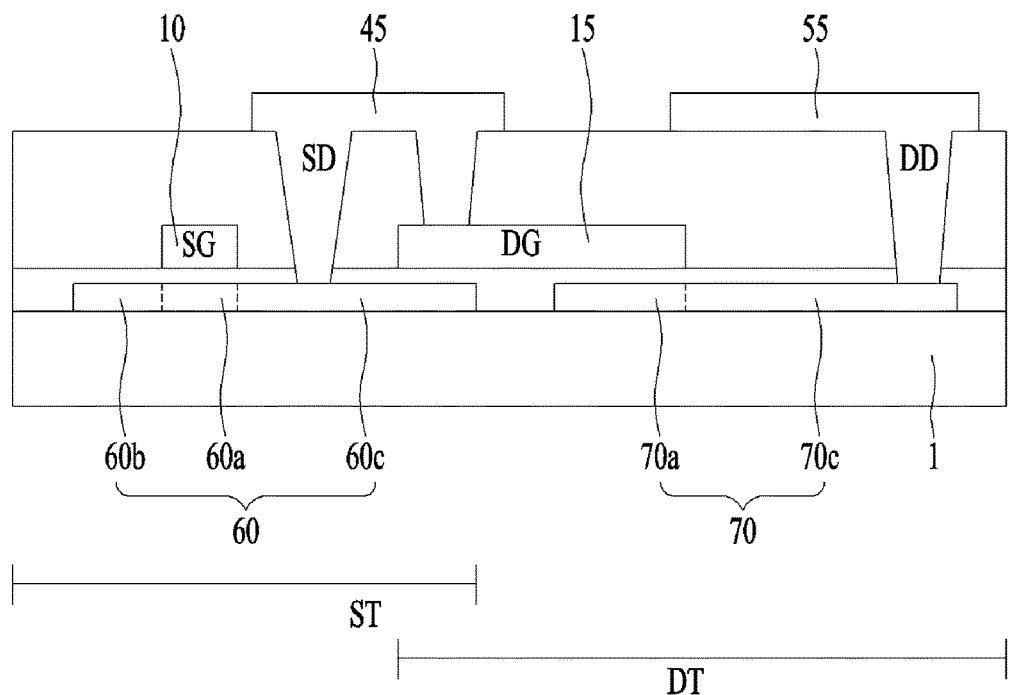
FIG. 2 is a cross-sectional view taken along a line passing through a drive transistor and a switching thin film transistor (TFT), which are illustrated in FIG. 1.

Hereinafter, preferred embodiments of the present invention will be described in detail with reference to the accompanying drawings. Throughout the disclosure, the same reference numerals designate substantially the same constituent elements. In describing the present invention, moreover, the detailed description will be omitted when a specific description of publicly known technologies to which the invention pertains is judged to obscure the gist of the present invention. In addition, names of constituent elements used in the following description are selected for easy understanding of the present invention, and may differ from names of practical products.

As mentioned above, in a bottom gate structure, an active layer is formed along a taper portion of a gate electrode, and crystalline components of the active layer are agglomerated during the crystallization of the active layer, thereby causing the active layer to be disconnected at the taper portion of the gate electrode. As such, a top gate structure used in the above-mentioned conventional organic light emitting display device to reduce or prevent such a disconnection.

The inventors of the present invention have filed Korean Patent Application No. 10-2015-0067321, which is directed to addressing such an active layer disconnection by changing the shape of a gate electrode in a bottom gate structure.

In an embodiment of the present invention, a driving gate electrode having a bottom gate structure has a gentle slope at a side portion thereof, in order to solve a disconnection of crystalline components of an active layer at a tapered portion of the gate electrode while securing a sufficient area for a storage capacitor. As a result, an effective circuit region is secured in a pixel area with increased integration degree and high resolution.

Figure 3:
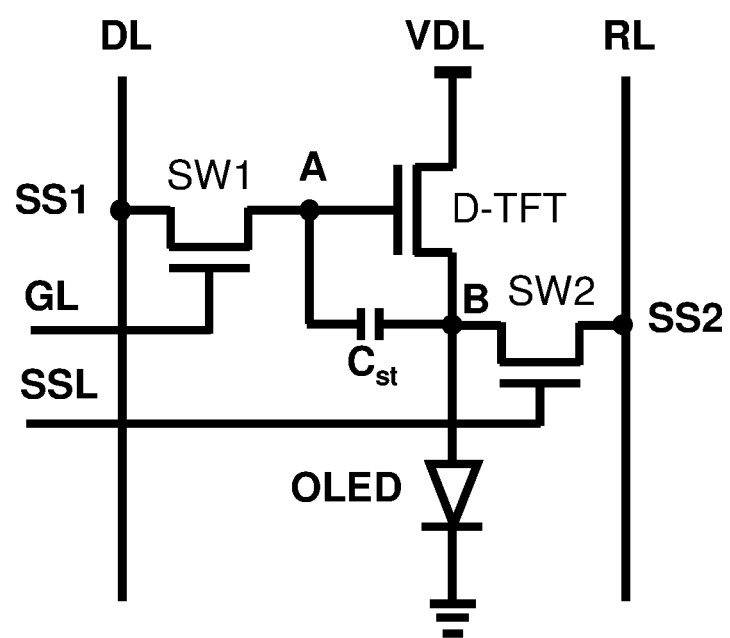
FIG. 3 is a circuit diagram illustrating one pixel of an organic light emitting display device according to an embodiment of the present invention.

FIG. 3 is a circuit diagram illustrating one pixel of an organic light emitting display device according to an embodiment of the present invention.

First, one pixel of the organic light emitting display device according to an embodiment of the present invention will be described in conjunction with a circuit configuration thereof. As illustrated in FIG. 3, the pixel includes a first switching thin film transistor (TFT) SW1 arranged between a gate line SL and a data line DL, a drive TFT D-TFT connected between the switching TFT SW1 and a current driving line VDL, a second switching TFT SW2 connected between the drive TFT D-TFT and a reference voltage line RL, a storage capacitor Cst connected between a connection point between the first switching TFT SW1 and the drive TFT D-TFT, namely, a first node A, and a connection point between the drive TFT D-TFT and the second switching TFT SW2, namely, a second node B, and an organic light emitting diode OLED arranged between the second node B and a ground terminal. A pixel area of the pixel is defined between the gate line GL and the data line DL, which cross each other. Pixel areas are arranged in a matrix on a substrate ("100" in FIG. 5).

Meanwhile, a switching drain electrode SD1 of the first switching TFT SW1 and a driving gate electrode DG of the drive TFT D-TFT are connected to the first node A. A driving electrode pattern DD of the drive TFT D-TFT and a second switching drain electrode SD2 of the second switching TFT SW2 are connected to the second node B.

Respective gate electrodes SG1 and SG2 of the first and second switching TFT's SW1 and SW2 are connected to the gate line GL and a sensing line SSL.

The first switching TFT SW1 selects a corresponding one of pixels, which is driven in accordance with a signal applied to the gate line GL. The drive TFT D-TFT, which is connected to the first switching TFT SW1, controls a drive current of the selected pixel, and supplies the controlled drive current to the organic light emitting diode OLED. Meanwhile, the storage capacitor Cst maintains a voltage supplied from the first switching TFT SW1, for one frame, and, as such, the drive TFT D-TFT is maintained at a predetermined voltage. To this end, the storage capacitor Cst is arranged between the driving gate electrode DG of the drive TFT D-TFT and the driving electrode pattern DD. In this case, the storage capacitor Cst, which is connected to the second switching TFT SW2, supplies, to the second node B, an initialization voltage supplied from the reference voltage line RL while the second switching TFT SW2 is turned on in accordance with supply of a sensing signal from the sensing line SSL. This means that initialization is achieved in accordance with application of the sensing signal from the sensing line SSL in a specific period.

First Embodiment

Figure 4:
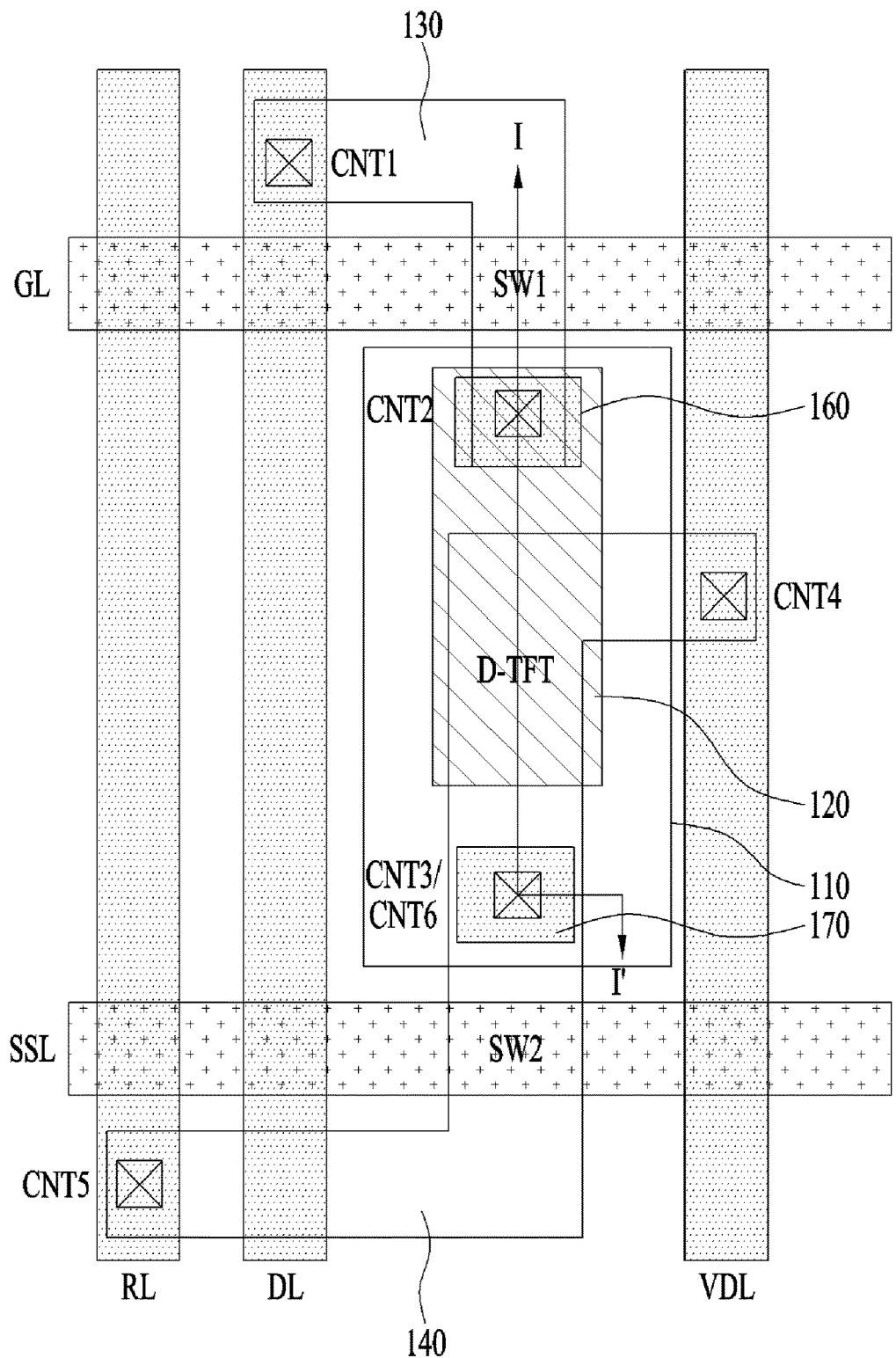
FIG. 4 is a plan view illustrating one pixel of an organic light emitting display device according to a first embodiment of the present invention.
Figure 5:
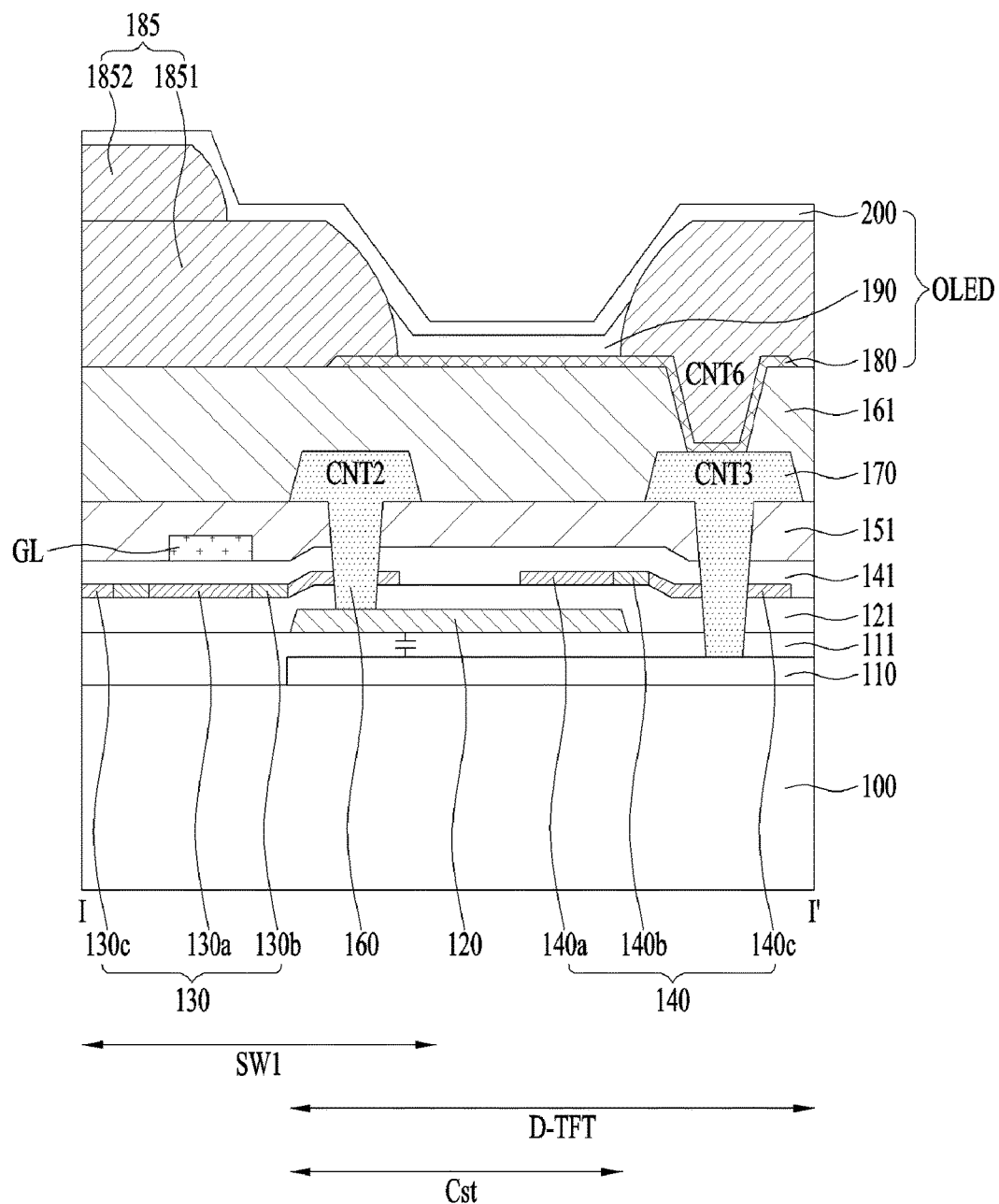
FIG. 5 is a cross-sectional view taken along line I-I' in FIG. 4.

FIG. 4 is a plan view illustrating one pixel of an organic light emitting display device according to a first embodiment of the present invention. FIG. 5 is a cross-sectional view taken along line I-I' in FIG. 4.

Hereinafter, the organic light emitting display device according to the first embodiment of the present invention, which has the circuit configuration of the above-described organic light emitting display device, will be described with reference to FIGS. 4 and 5. The organic light emitting display device according to the first embodiment of the present invention has the same electrical connection configuration as the above-described circuit configuration, except for planar and cross-sectional arrangements thereof.

As illustrated in FIGS. 4 and 5, one pixel area of the organic light emitting display device according to the first embodiment of the present invention may be defined by a gate line GL and a data line DL, which cross each other.

In each pixel area of the organic light emitting display device, a sensing line SSL is arranged in parallel to the gate line, and a current driving line VDL and a reference voltage line RL are arranged in parallel to the data line DL. The organic light emitting display device includes, in each pixel area, a storage capacitor Cst defined by a storage electrode 110 and a driving gate electrode 120, which are arranged on different layers in the pixel area while overlapping each other, a first active layer 130 connected, at opposite ends thereof, to the driving gate electrode 120 and the data line DL, and a second active layer 140 spaced apart from the first active layer 130 while overlapping the driving gate electrode 120. The second active layer 140 has opposite side portions connected to the current drive line VDL and the storage electrode 110 while protruding laterally from the driving gate electrode 120.

In this case, the second active layer 140 extends from a portion thereof connected to the storage electrode 110 while crossing the sensing line SSL, and, as such, is connected to the reference voltage line RL.

The first and second active layers 130 and 140 are arranged on the same layer. The driving gate electrode 120 is arranged beneath the first and second active layers 130 and 140. The storage electrode 110 is arranged beneath the driving gate electrode 120.

The organic light emitting display device further includes, in each pixel area, a switching electrode pattern 160 arranged over the first active layer 130 in a region where the first active layer 130 and driving gate electrode 120 overlap each other. The switching electrode pattern 160 corresponds to the node A in the circuit of FIG. 3. The switching electrode pattern 160 itself functions as a drain electrode of a first switching TFT SW1. The first switching TFT SW1 is connected to the switching electrode pattern 160, together with a drive TFT D-TFT and a storage capacitor Cst.

The switching electrode pattern 160 extends through one end of the first active layer 130 while being laterally connected to the first active layer 130. The switching electrode pattern 160 is also connected to an upper surface of the driving gate electrode 120. Thus, electrical connection among the driving gate electrode 120, first active layer 130 and switching electrode pattern 160 is provided.

The organic light emitting display device further includes, in each pixel area, a driving electrode pattern 170 arranged over the second active layer 140 such that the driving electrode pattern 170 overlaps the storage electrode 110 without overlapping the driving gate electrode 120. In this case, the driving electrode pattern 170 extends through the second active layer 140 while being laterally connected to the second active layer 140. The driving electrode pattern 170 is also connected to an upper surface of the storage electrode 110. Thus, electrical connection among the storage electrode 110, second active layer 140 and driving electrode pattern 170 is provided. In this case, the drive TFT D-TFT is defined by the driving gate electrode 120, the second active layer 140, which has a driving channel region 140a at a portion thereof overlapping the driving gate electrode 120, the current driving line VDL connected to the second active layer 140, and the driving electrode pattern 170. The storage capacitor Cst is formed between the drive TFT D-TFT and the switching electrode pattern 160, which functions as the drain electrode of the first switching TFT SW1 when a voltage signal is applied to the storage electrode 110 via the driving electrode pattern 170. Meanwhile, the driving electrode pattern 170 corresponds to the node B in the circuit of FIG. 3. The driving electrode pattern 170 itself functions as a drain electrode of the drive TFT D-TFT. The drive TFT D-TFT and storage capacitor Cst are connected to the driving electrode pattern 170, together with a second switching TFT SW2.

In this case, the first switching TFT SW1 is defined by the gate line GL, the first active layer 130, which has a first switching channel region 160a at a portion thereof overlapping the gate line GL, the switching electrode pattern 160, which is laterally connected to one end of the first active layer 130, and the data line DL, which is connected to the other end of the first active layer. Meanwhile, as described above, the drive TFT D-TFT is defined by the driving gate electrode 120, the second active layer 140, which has the driving channel region 140a at the portion thereof overlapping the driving gate electrode 120, the current driving line VDL connected to the second active layer 140, and the driving electrode pattern 170.

In this case, the driving gate electrode 120 not only functions as a gate electrode of the drive TFT D-TFT, but also functions as an opposite storage electrode of the storage capacitor Cst in accordance with overlap thereof with the storage electrode. The driving gate electrode 120 is formed to overlap with both the area where the first switching TFT SW1 is arranged and the area where the drive TFT D-TFT is arranged. Accordingly, a separate area for formation of the storage capacitor Cst is not required, and the area of the first switching TFT SW1 and the area of the drive TFT D-TFT share the area of the storage capacitor Cst with each other. Thus, the circuit integration degree of the pixel area is enhanced.

Meanwhile, the second switching TFT SW2 is also included in the organic light emitting display device. The second switching TFT SW2 is arranged at the portion of the second active layer 140 extending to the sensing line SSL. The second switching TFT SW2 is constituted by the second active layer 140, which has a second switching channel at a portion thereof overlapping the sensing line SSL, the reference voltage line RL connected to the second active layer 140, and the driving electrode pattern 170.

In addition, the first switching TFT SW1 and drive TFT D-TFT are directly connected without using a separate electrode. That is, the switching electrode pattern 160, which functions as a switching drain electrode of the first switching TFT SW1 while being arranged at an upper side, is directly connected to the driving gate electrode 120 of the drive TFT D-TFT, which is arranged at a lower side. Accordingly, it may be possible to eliminate degradation of integration degree occurring in the conventional planar double connection structure.

Meanwhile, gate electrodes of the first switching TFT SW1 and second switching TFT SW2 are defined by portions of the gate line GL and sensing line SSL crossing the first and second active layers 130 and 140, respectively. The gate line GL and sensing line SSL are arranged over the first and second active layers 130 and 140 and, as such, have top gate structures, respectively. On the other hand, the driving gate electrode 120 is arranged beneath the first and second active layers 130 and 140 and, as such, has a bottom gate structure. In this case, there may be an advantage in forming the first and second switching TFTs and drive TFT in an overlapping manner. As a result, a circuit having a high integration degree may be formed in the pixel area. Accordingly, high resolution may be easily secured. In this case, the gate line GL and sensing line SSL are arranged over the first and second active layers, respectively, and the data line DL, reference voltage line RL and current drive line VDL are arranged over both the gate line GL and the sensing line SSL.

The first active layer 130 has a "180°-rotated L" shape such that the first active layer 130 is laterally connected to the switching electrode pattern 160 at one end thereof while being laterally connected to the data line DL at the other end thereof. The opposite ends of the active layer 130 have highly doped regions 130c formed through doping with impurity ions at a high concentration, at lateral connection portions thereof, respectively. A lightly doped region 130b may be provided between an undoped region of the first active layer 130, namely, the first switching channel region 160a, and each highly doped region 130c, in order to achieve a reduction in off-current. Provision of the lightly doped region 130b is selective and, as such, may be omitted.

The second active layer 140 has a reversed Z" shape. The second active layer 140 has the drive TFT D-TFT and second switching TFT SW2 at the portions thereof overlapping the driving gate electrode 120 and sensing line SSL, respectively. The second active layer 140 is connected, at opposite ends thereof, to the current drive line VDL and reference voltage line RL, which are arranged over the second active layer 140, respectively. The driving electrode pattern 170, which is shared as an electrode pattern by the drive TFT D-TFT and second switching TFT SW2, is formed over a portion of the second actively layer 140 arranged outside the driving gate electrode 120 while being connected to the second active layer 140. In this case, the driving electrode pattern 170 may be a common drain electrode or common source electrode of the drive TFT D-TFT and second switching TFT SW2. The electrode function of the driving electrode pattern 170 may be varied in accordance with whether the conduction type of each TFT is n type or p type. The common drain electrode or common source electrode is connected to a first electrode of the organic light emitting diode OLED and, as such, supplies a drive current to the organic light emitting diode OLED.

The second active layer 140 has highly doped regions 140*c* at a portion thereof connected to the driving electrode pattern 170 protruding from the driving gate electrode 120 and a portion thereof connected to the drive current line VDL. The second active layer 140 also has a highly doped region 140*c* at a portion thereof connected to the reference voltage line: RL. Similar to the first active layer 130, the driving channel region of the second active layer 140 overlapping the driving gate electrode 120 and the second switching channel region of the second active layer 140 crossing the sensing line SSL are undoped regions 140*a*. A lightly doped region 140*b* may be provided between each undoped channel region 140*a* and the corresponding highly doped region 140*c*, in order to achieve a reduction in off-current. The lateral connection between the driving electrode pattern 170 and the second active layer 140 is provided at the corresponding highly doped region 140*c* and, as such, the driving electrode pattern 170 and second active layer 140 may be connected at low resistance.

Meanwhile, shapes of the first and second active layers 130 and 140 are limited to the illustrated shapes. The first and second active layers 130 and 140 may have various shapes, so long as they are spaced apart from each other.

The organic light emitting diode OLED includes a first electrode 180, an organic light emitting layer 190 arranged in a light emission area, and a second electrode 200 disposed on the organic light emitting layer 190. If necessary, a hole injection layer and a hole transport layer may be disposed beneath the organic light emitting layer 190. In addition, an electrode transport layer and an electrode injection layer may be disposed over the organic light emitting layer 190. In this case, the hole injection layer, hole transport layer, organic light emitting layer, electrode transport layer and electrode injection layer are made of organic materials. Each organic material is deposited using a metal mask having an opening, in accordance with an evaporation process in which the organic material is deposited through the opening through evaporation.

In addition, the organic light emitting diode OLED includes a bank 185 arranged on the first electrode 180 along a boundary of the pixel area, in order to define the light emission area. The bank 185 may have a double step structure and, as such, may have a first thickness portion 1851 and a second thickness portion 1852. In the double step structure, the first thickness portion 1851 substantially functions to define the light emission area, and the second thickness portion 1852 directly prevents the metal mask from coining into contact with the first thickness portion 1851 when the metal mask is bent downwards due to the weight thereof during deposition of organic materials including the organic light emitting layer 190, thereby preventing the first thickness portion 1851 from collapsing.

In an embodiment of the present invention, the light emission area of the organic light emitting diode OLED may be determined to have a maximum size, so long as light emitting colors are not mixed during the deposition process. This is because the organic light emitting diode OLED according to an embodiment of the present invention emits light in a top emission manner and, as such, light emission of the organic light emitting diode OLED is achieved even though the organic light emitting diode OLED overlaps the circuit configuration in the pixel area, in detail, light shield wiring or a light shield pattern is included in the circuit configuration arranged beneath the organic light emitting diode OLED. Accordingly, the light emission area may completely overlap with the storage capacitor defined by overlapping portions of the driving gate electrode 120 and storage electrode 110. The light emission area may also be maximally extended at a portion thereof other than the portion overlapping the storage capacitor, so long as no color mixing occurs between adjacent pixels. In this case, the first electrode 180 may be a reflective electrode, and the second electrode 200 may be a transparent electrode, in order to achieve effective top emission.

Figure 6:
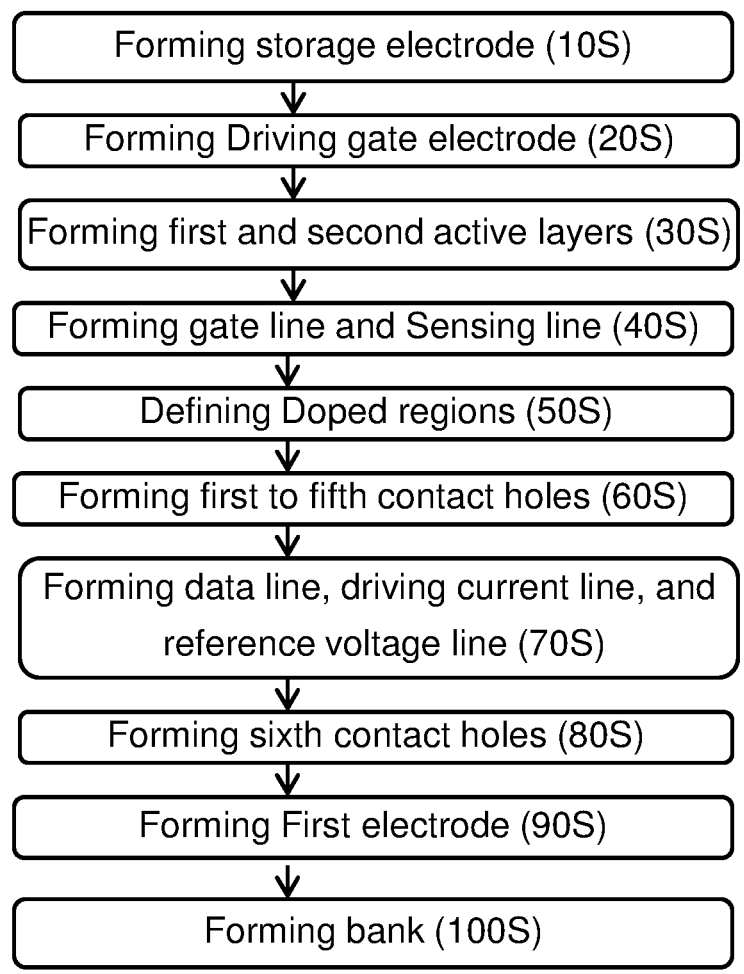
FIG. 6 is a flowchart illustrating a procedure of manufacturing an organic light emitting display device according to an embodiment of the present invention.

FIG. 6 is a flowchart illustrating a procedure of manufacturing the organic light emitting display device according to an embodiment of the present invention.

Hereinafter, a method for manufacturing the organic light emitting display device according to an embodiment of the present invention will be described with reference to FIGS. 4 to 6.

First, a substrate 100, which has a plurality of pixel areas arranged in a matrix, is prepared.

The substrate 100 may be further provided with a buffer layer (not shown) formed over the substrate 100.

Thereafter, an island-shaped storage capacitor 110 is formed on the substrate 100 at each pixel area (10S).

Subsequently, a driving gate electrode 120 is formed on the storage capacitor 110, to overlap with the storage capacitor 110, under the condition that a first interlayer insulating film 111 is interposed between the driving gate electrode 120 and the storage capacitor 110 (20S). In this case, the driving gate electrode 120 has a low lateral slope of about 50° or less.

Thereafter, a first active layer 130 and a second active layer 140 are formed on the driving gate electrode 120 such that the first and second active layers 130 and 140 are spaced apart from each other via a first gate insulating film 121, and overlap with the driving gate electrode 120 and storage electrode 110, respectively (30S). The first and second active layer 130 and 140 are initially in an amorphous state. In this state, the first and second active layer 130 and 140 may not provide sufficient mobility when used as semiconductor layers of TFTs. To this end, the first and second active layers 130 and 140 are crystallized using an excimer laser before being patterned into the illustrated shapes and, as such, are formed into polysilicon layers. In the crystallization process, heat is applied to the first and second active layers 130 and 140 and, as such, the first and second active layers 130 and 140 may be disconnected at portions thereof inclined along side portions of the driving gate electrode 120. In order to prevent such disconnection, accordingly, driving gate electrode 120 has a small lateral slope.

Thereafter, a gate line GL and a sensing line SSL are formed in parallel on the first active layer 130, to cross the first active layer 130 and second active layer 140, respectively, under the condition that a second gate insulating film 141 is interposed between the first active layer 130 and the gate line CL and sensing line SSL (40S).

Subsequently, an overlap region of the gate line GL and first active layer 130 overlap each other and a peripheral region thereof, an overlap region of the sensing line SSL and second active layer 140 and a peripheral region thereof, and an overlap region of the driving gate electrode 120 and second active layer 140 and a peripheral region thereof are masked by a photoresist film pattern. In this state, doping with high-concentration impurity ions is carried out, thereby forming highly doped regions 130c and 140c (50S).

The photoresist film pattern is then asked such that the photoresist film pattern is left only at the overlap region of the driving gate electrode 120 and second active layer 140. In this state, lightly doped regions 130b and 140b are formed at regions exposed after the ashing, respectively.

The photoresist film pattern is removed through stripping.

Thereafter, a second interlayer insulating film 151 is formed over the second gate insulating film 141 including the gate line GL and sensing line SSL.

Subsequently, the second interlayer insulating film 151, second gate insulating film 141, first active layer 130, first gate insulating film 121, and first interlayer insulating film 111 are selectively removed in regions corresponding to opposite ends of the first active layer 130, opposite ends of the second active layer 140, and a portion of the second active layer 140 disposed between the opposite ends of the second active layer 140 while protruding from the driving gate electrode 120, thereby forming first to fifth contact holes CNT1 to CNT5 (60S). In this removal process, etching is carried out until metal surfaces are exposed. For example, in a region where one end of the first active layer 130 is arranged, the first active layer 130 is completely perforated such that an upper surface of the driving gate electrode 120 disposed beneath the first active layer 130 is exposed, and, as such, the second contact hole CNT2 is formed. Meanwhile, in a region where the second active layer 140 protrudes from the driving gate electrode 120 between the opposite ends of the second active layer 140, the second active layer 140 is completely perforated such that an upper surface of the storage electrode 110 disposed beneath the second active layer 140 is exposed, and, as such, the third contact hole CNT3 is formed. In addition, in a region where the other end of the first active layer 130 is arranged, the first active layer 130 is completely perforated such that the first gate insulating film 121 and first interlayer insulating film 111 disposed beneath the first active layer 130 are etched, thereby forming the first contact hole CNT1. Similarly, in regions where the opposite ends of the second active layers 140 are arranged, respectively, the second active layer 140 is completely perforated such that the first gate insulating film 121 and first interlayer insulating film 111 disposed beneath the second active layer 140 are etched, thereby forming the fourth and fifth contact holes CNT4 and CNT5.

In the above-described etching process, an etchant or plasma gas exhibiting similar etching rates for the insulating films and active layers while exhibiting etching rates for metals different from the etching rates for the insulating films and active layers is used.

Thereafter, a metal is deposited over the second interlayer insulating film 151. The deposited metal is then etched and, as such, a data line DL connected to one end of the first active layer 130, and a current driving line VDL and a reference voltage line RL, which are connected to the opposite ends of the second active layer 140, respectively, are formed in a direction crossing the gate line GL. In the same process as described above, a switching electrode pattern 160 connected to the other end of the first active layer 130 and a driving electrode pattern 170 connected to the storage electrode 110 protruding from the driving gate electrode 120 are formed (70S).

In this case, the data line DL extends through the first active layer 130 and insulating films 121 and 111 disposed beneath the first active layer 130 in the region corresponding to the first contact hole CNT1. Similarly, the reference voltage line RL and drive voltage line VDL extend through the second active layer 140 and insulating films 1:21 and 111 disposed beneath the second active layer 140 in the regions corresponding to the fourth and fifth contact holes CNT4 and CNT5, respectively. In addition, the switching electrode pattern 160 is connected to the driving gate electrode 120 in the region corresponding to the second contact hole CNT2, and the driving electrode pattern 170 is connected to the storage electrode 110 exposed in the region corresponding to the third contact hole CNT3.

After formation of the first and second switching TFTs SW1 and SW2 and drive TFT D-TFT as described above, a passivation film 161 is formed over the entire upper surface of the second interlayer insulating film 141 including the data line DL, drive current line VDL, reference voltage line RL, switching electrode pattern 160 and driving electrode pattern 170. Thereafter, a sixth contact hole CNT6 is formed to expose the driving electrode pattern 170 of the drive TFT D-TFT (80S).

Subsequently, a first electrode 180 is formed such that the first electrode 180 is connected to the driving electrode pattern 170 via the sixth contact hole CNT6 (90S).

A bank 185 is formed such that the bank 180 opens the light emission area while partially overlapping the first electrode 180 (100S). In this case, the bank 185 may include a first thickness portion 1851 defining the light emission area, and a second thickness portion 1852 formed on the first thickness portion 1851 while having a smaller width than the first thickness portion 1851. The second thickness portion 1852 functions as a spacer for preventing a metal mask from coming into direct contact with the first thickness portion 1851 during an organic material deposition process.

Thereafter, organic materials including an organic light emitting layer 190 are deposited using a metal mask having an opening corresponding to the light emission area.

A second electrode 200 is then formed on the organic light emitting layer 190.

In this case, the lamination structure of the first electrode 180, organic light emitting layer 190, and second electrode 200 forms an organic light emitting diode MED.

Meanwhile, the above-described procedures 10S to 100S may require masks, respectively. In the organic light emitting display device according to an embodiment of the present invention, a lower metal pattern shielding the active layers beneath the active layers is eliminated. To this end, a bottom gate structure is applied to a portion of the drive TFT mainly and importantly acting in association with drive current characteristics. That is, the driving gate electrode is first formed, and the active s are subsequently formed. Accordingly, even in the above-described case, it may be possible to prevent the active layers of the drive TFT from being influenced or damaged by external light incident thereupon at the bottom side. Thus, it may be possible to reduce two or more masking processes for pattern formation and voltage application when a lower metal pattern is provided, as in the conventional case.

If necessary, doping with high-concentration impurity ions and low-concentration impurity ions into the first and second active layers 130 and 140 may be carried out in separate manners before and after formation of the gate line.

Although the second electrode 200 of the organic light emitting diode OLED is illustrated in the circuit diagram of FIG. 3 as being grounded, the present invention is not limited thereto. A certain voltage may be applied to the second electrode 200. The second electrode 200 may be deposited over the entire upper surface without using a separate mask. After deposition, the second electrode 200 is connected to a common ground at a peripheral region thereof, or a predetermined common voltage is applied to the second electrode 200.

Second Embodiment

Figure 7:
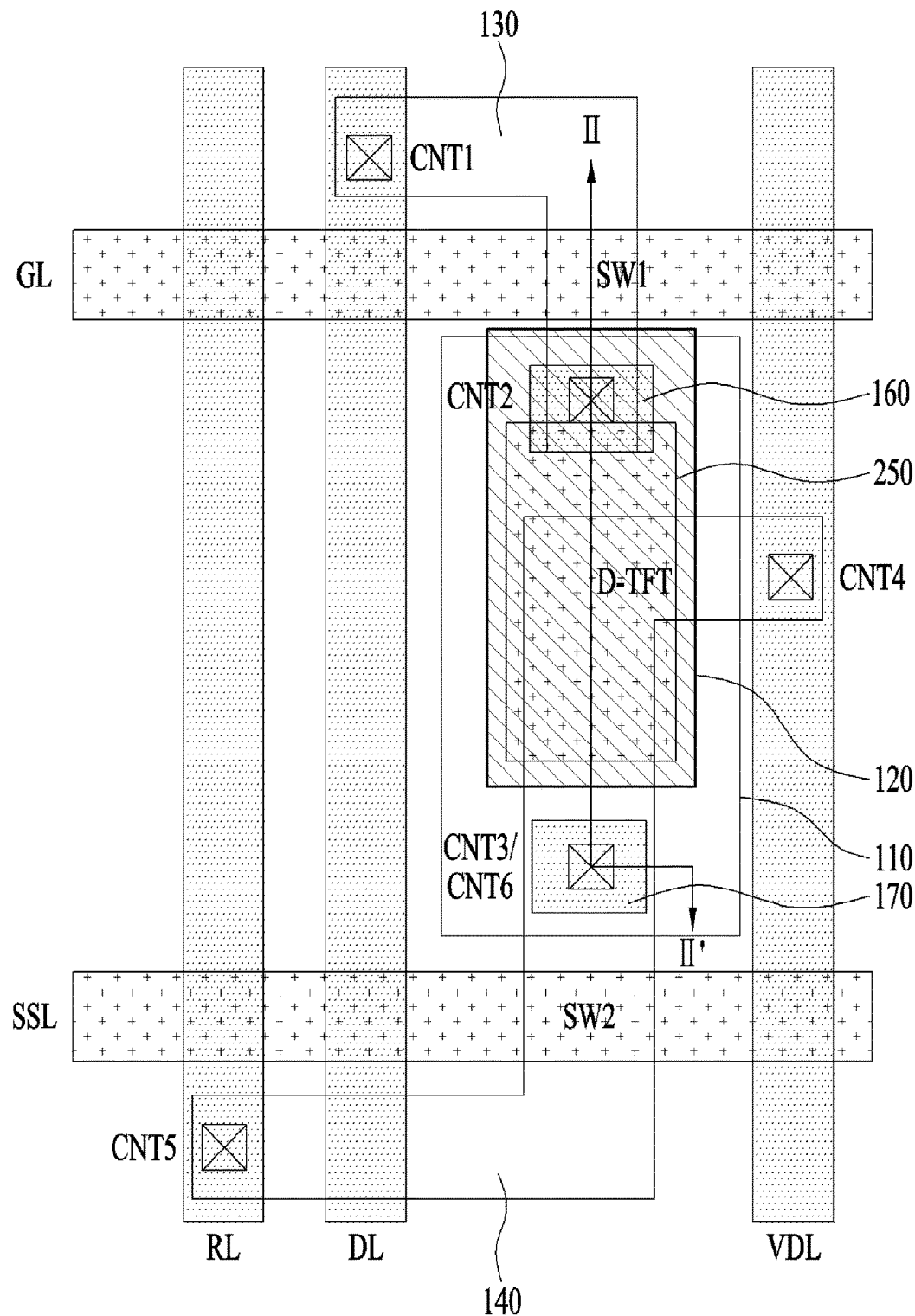
FIG. 7 is a plan view illustrating one pixel of an organic light emitting display device according to a second embodiment of the present invention.
Figure 8A:
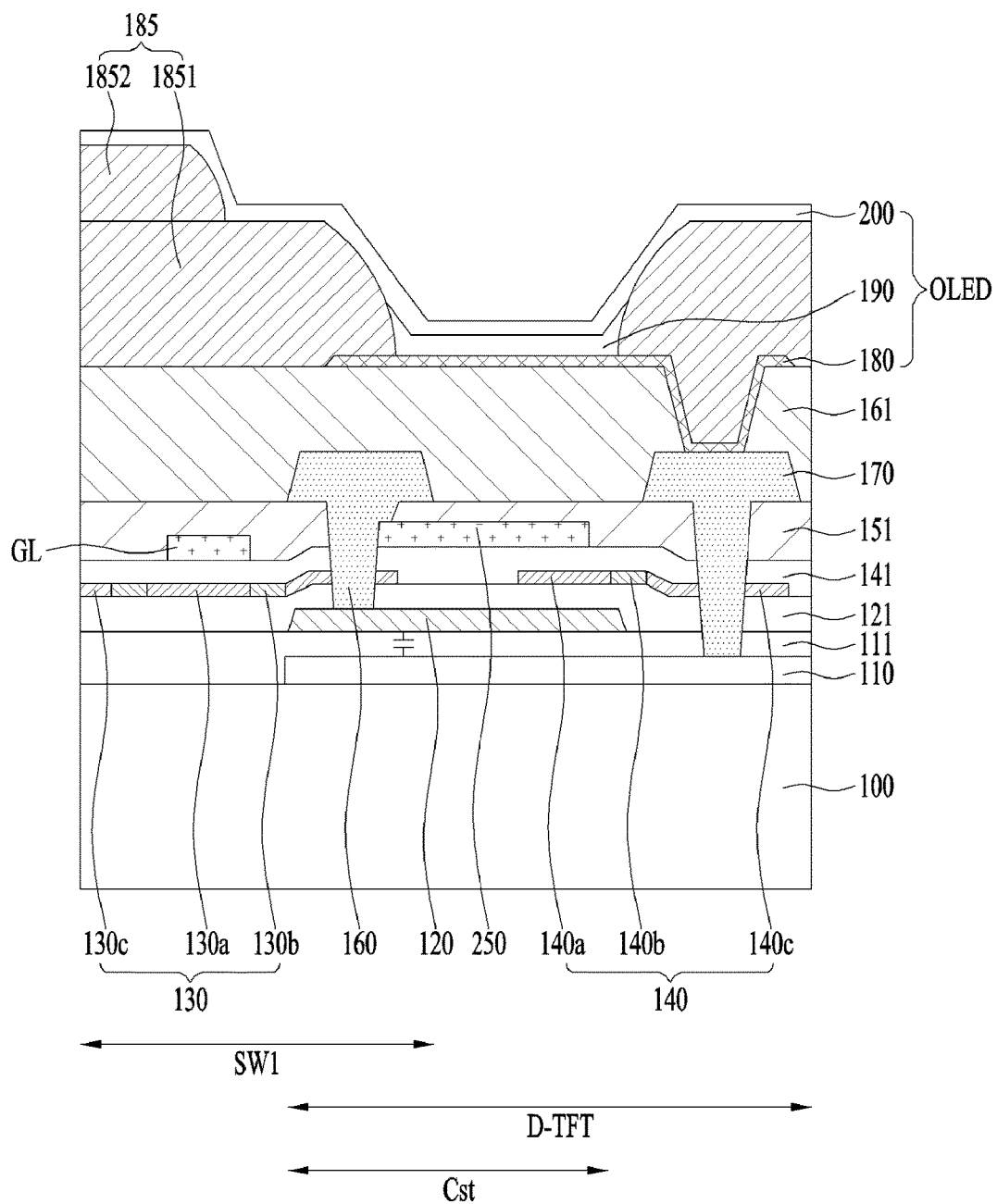
FIG. 8A is a cross-sectional view taken along line II-II' in FIG. 7.

FIG. 7 is a plan view illustrating one pixel of an organic light emitting display device according to a second embodiment of the present invention. FIG. 8A is a cross-sectional view taken along line II-II' in FIG. 7.

The organic light emitting display device according to the second embodiment of the present invention illustrated in FIGS. 7 and 8A has features in that the organic light emitting display device has a double gate electrode structure in order to enhance mobility characteristics of the drive TFT, and the remaining configuration of the organic light emitting display device is identical to that of the first embodiment.

That is, the drive TFT includes a driving gate electrode arranged, as a first gate electrode, beneath the second active layer 140, and an auxiliary driving gate electrode 250 arranged, as a second gate electrode, over the second active layer 140. In this case, the auxiliary driving gate electrode 50 is disposed on the same layer as the gate line, that is, on the second gate insulating film 141, while partially overlapping the second active layer 140. Accordingly, when the lightly doped regions 130b and 140h are omitted in the impurity doping processes, it may be possible to form the highly doped regions 130c and 140c under the condition that channel regions are protected by the gate line, sensing line and auxiliary driving gate electrode 250, without using a mask for defining a photoresist film pattern.

In accordance with formation of the double gate structure for the drive TFT, it may be possible to enhance mobility of the drive TFT and on-current characteristics, as compared to other TFTs provided in the pixel area.

Similar to the first embodiment, in the second embodiment, it may be possible to define a storage capacitor by arranging the storage electrode of the first embodiment on a layer different from that of the first embodiment under the condition that the storage electrode overlaps the driving gate electrode. In this case, the storage capacitor is not influenced by arrangement of other TFTs in the pixel area and, as such, it may be possible to enhance circuit integration degree and to secure high resolution.

In addition, the switching electrode pattern 160, which is one electrode of the first switching TFT, is connected to the auxiliary driving gate electrode 250. The switching electrode pattern 160 extends through the first active layer 130 such that the switching electrode pattern 160 is connected to the driving gate electrode 120. Accordingly, planar long secondary connection is not required for connection between the switching TFT and the drive TFT and, as such, high resolution may be easily secured. The switching electrode pattern 160 is connected to a side surface of the auxiliary driving gate electrode 250 and an upper surface portion of the auxiliary driving gate electrode 250 in order to achieve resistance reduction while securing a sufficient connection area.

Figure 8B:
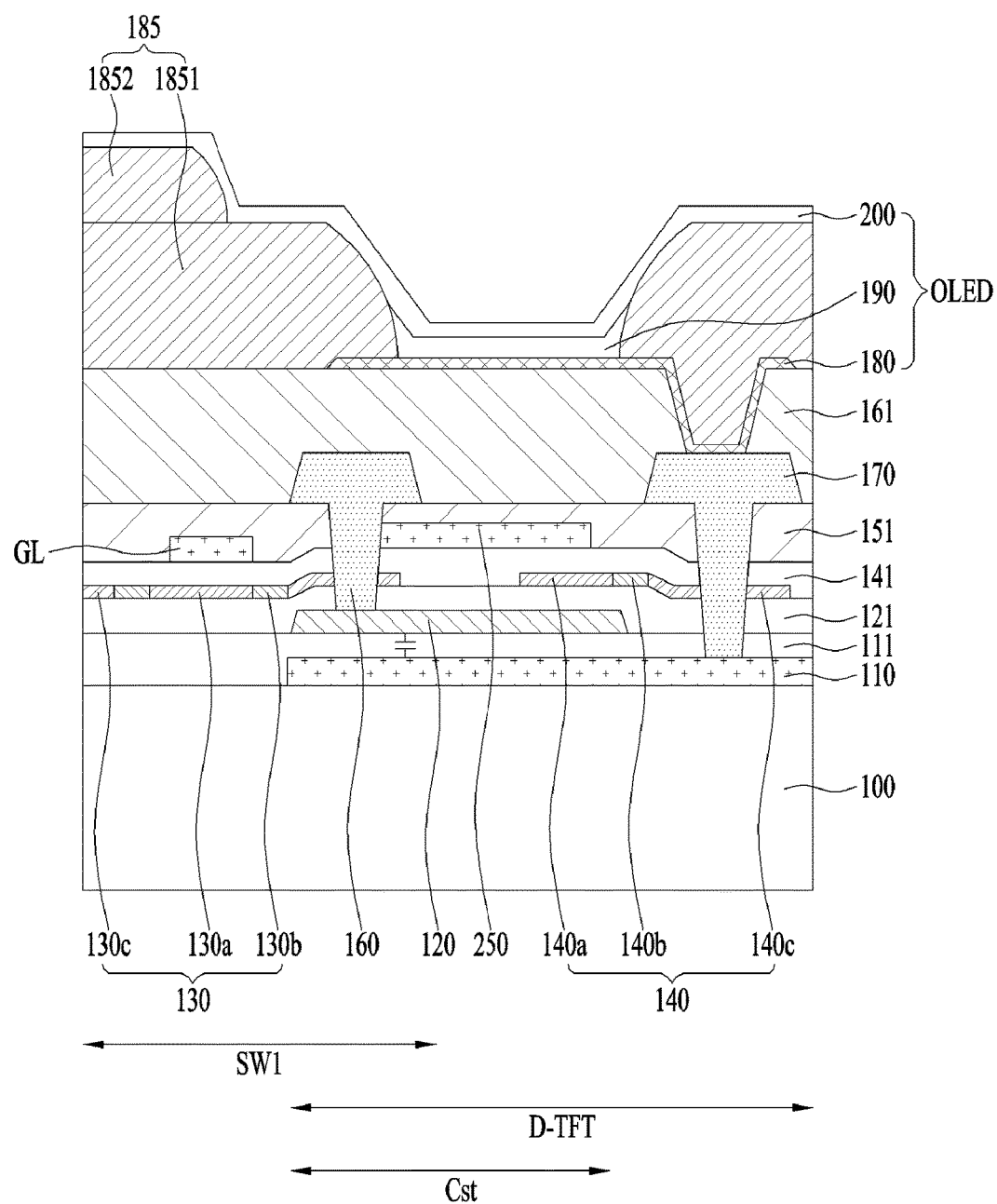
FIGS. 8B and 8C are cross-sectional views illustrating embodiments modified from the second embodiment.
Figure 8C:
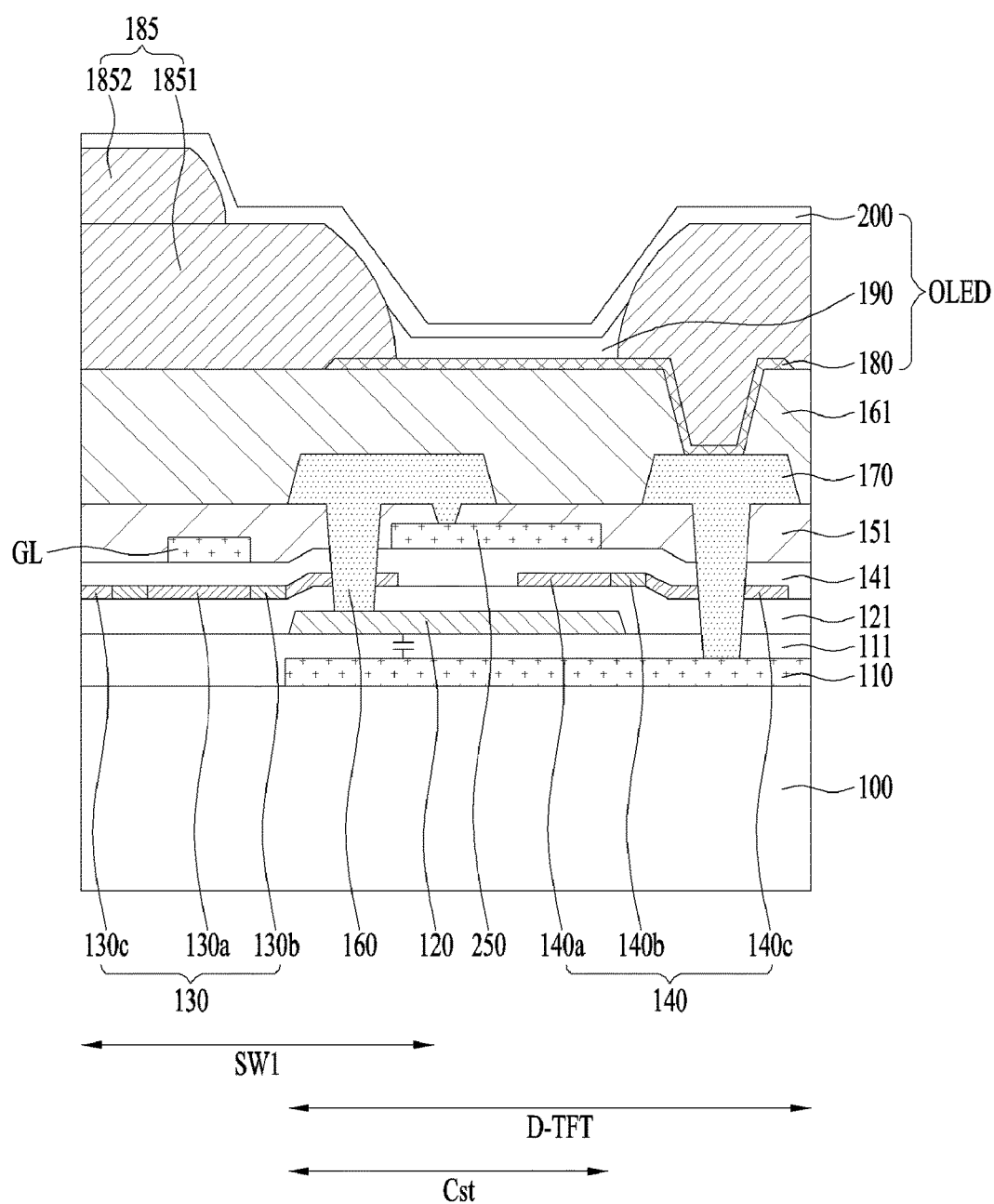

FIGS. 8B and 8C are cross-sectional views illustrating embodiments modified from the second embodiment.

If necessary, the switching electrode pattern 160 may be connected only to the side surface of the auxiliary driving gate electrode 250, as illustrated in FIG. 8B. Alternatively, as illustrated in FIG. 8C, in a process for connecting the switching electrode pattern 160 to the driving gate electrode 120, a contact hole for exposing a portion of the auxiliary driving gate electrode 250 may be formed in addition to the contact hole for exposing the driving gate electrode 120, in order to achieve electrical connection between an upper surface of the auxiliary driving gate electrode 250 and the switching electrode pattern 160. In addition, in the case of FIG. 8C, the auxiliary driving gate electrode 250 may further extend laterally, to be laterally connected to the switching electrode pattern 160. Thus, the lateral connection and the connection through the contact hole may be simultaneously achieved.

Hereinafter, effects of the organic light emitting display device according to an embodiment of the present invention will be described.

Figure 9:
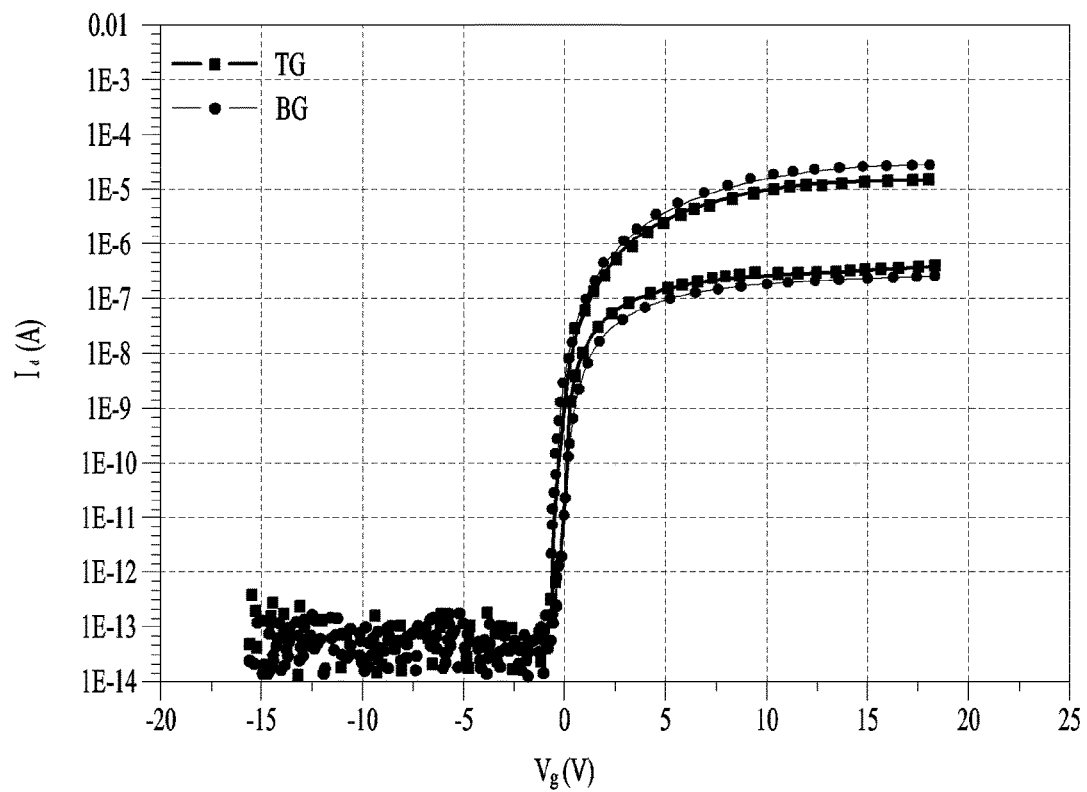
FIG. 9 is a graph depicting $V_g$-$I_d$ characteristics exhibited when a drive has a top gate structure and when the drive TFT has a bottom gate structure.

FIG. 9 is a graph depicting $V_g$-$I_d$ characteristics exhibited when the drive TFT has a top gate structure and when the drive TFT has a bottom gate structure.

In FIG. 9, transfer curve characteristics are depicted. Referring to FIG. 9, it can be seen that, when the voltage applied to the driving gate electrode increases, the bottom gate structure has slightly higher drive current Id than that of the top gate structure.

Figure 10:
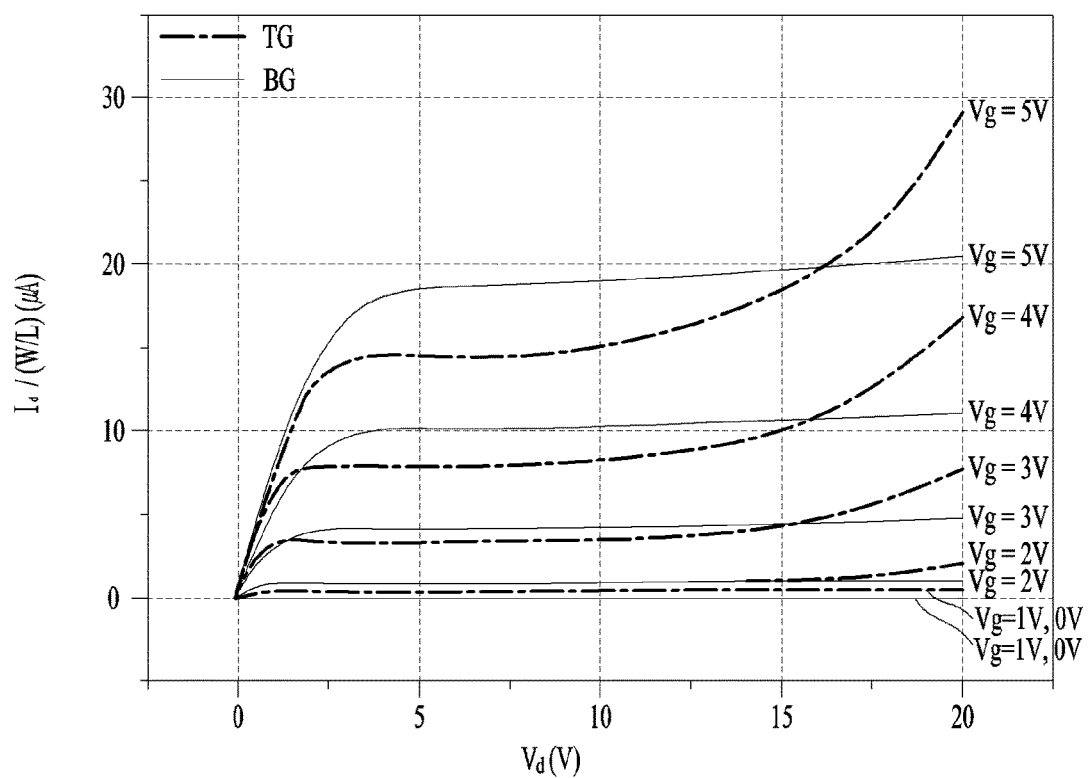
FIG. 10 is a graph depicting $V_d$-$I_d$ characteristics exhibited when the drive. TFT has a top gate structure and when the drive TFT has a bottom gate structure.

FIG. 10 is a graph depicting $V_d$-$I_d$ characteristics exhibited when the drive TFT has a top gate structure and when the drive TFT has a bottom gate structure.

In FIG. 10, output curve characteristics are depicted. Referring to FIG. 10, it can be seen that, when a gate voltage is sequentially increased from 0V to 4V in the case in which the gate electrode of the drive TFT is of a bottom gate type, drive current $I_d$ in the bottom gate structure is almost saturated in accordance with a voltage $V_d$ of the drain electrode, whereas drive current $I_d$ in the top gate structure exhibits non-linear increase in accordance with the voltage $V_d$ of the drain electrode. This means that, in the case of the top gate structure, output characteristics thereof exhibit unstableness in accordance with a variation in the voltage $V_d$ of the drain electrode. Accordingly, superiority of the bottom gate structure exhibiting relatively stable output characteristics may be verified.

That is, in addition to the above-described advantages, namely, high integration and high resolution, the organic light emitting display device according to an embodiment of the present invention has advantages in that the drive current exhibits saturation characteristics, and kink effects are stabilized, as the configuration of the drive TFT, which has direct influence on drive current characteristics, among elements included in the pixel area, has a bottom gate structure.

In addition, an overlap area of the storage capacitor is secured by a dual gate structure and, as such, high resolution may be secured.

In accordance with the organic light emitting display device according to an embodiment of the present invention and the method for manufacturing the same, the following effects are provided.

First, for formation of the storage electrode, no separate space is provided, except for spaces given for TFTs. The area overlapping one of the TFTs, in particular, the area overlapping the driving gate electrode of the drive ITT is used as an opposite storage electrode, and a storage electrode is provided at a layer different from that of the driving gate electrode such that the storage electrode overlaps the driving gate electrode, to define the storage capacitor in a region where the storage electrode overlaps the driving gate electrode. Accordingly, it may be possible to obtain a sufficient storage capacitance without significant interference with arrangement of the TFT in a pixel area.

Second, a bottom gate electrode exhibiting excellent drive current saturation characteristics and stable kink characteristics is applied to the drive TFT and, as such, reliability of a pixel circuit in the organic light emitting display device may be enhanced.

Third, connection between the switching TFT and the drive TFT is achieved by extending one electrode of the switching TFT to the driving gate electrode through an active layer, to be connected to the driving gate electrode. Accordingly, it may be possible to omit a planar connection area for connection between the TFTs and, as such, there are advantages in association with high integration and high resolution.

Fourth, the drive TFT is provided with the driving gate electrode arranged beneath the active layer, whereas the switching TFT is provided with a gate line or a sensing line, which is arranged over the active layer. In this regard, the gate electrodes (lines) of the TFTs are arranged at different layers, respectively. According, if necessary, a double gate electrode may be easily applied to a TFT having high mobility characteristics.

Fifth, a lower metal pattern used in a top gate structure to shield active layers beneath the active layers may be eliminated. A bottom gate structure may be applied to a portion of the drive TFT mainly and importantly acting in association with drive current characteristics. That is, the driving gate electrode is first formed, and the active layers are subsequently formed. Accordingly, even in the above-described case, it may be possible to prevent the active layers of the drive TFT from being influenced or damaged by external light incident thereupon at the bottom side. Thus, it may be possible to reduce two or more masking processes for pattern formation voltage application when a lower metal pattern is provided, as in the conventional case.

Sixth, in associated with the drive TFT, active layers may be formed over a driving gate electrode after formation of the driving gate electrode. Accordingly, a channel region may be defined irrespective of the shape of the driving gate electrode and, as such, the degree of design freedom may be increased.

It will be apparent to those skilled in the art that various modifications and variations can be made in the present invention without departing from the spirit or scope of the inventions. Thus, it is intended that the present invention cover the modifications and variations of this invention provided they come within the scope of the appended claims and their equivalents.

What is claimed is:

1. An organic light emitting display device comprising:
    a substrate having a plurality of pixels in a matrix;
    a storage electrode at each of the pixels on the substrate;
    a driving gate electrode over the storage electrode via a first interlayer insulating film, wherein the driving gate electrode overlaps the storage electrode, to define a storage capacitor;
    first and second active layers over the driving gate electrode via a gate insulating film, wherein the first and second active layers are spaced apart from each other while overlapping the driving gate electrode and the storage electrode, respectively;
    a gate line and a sensing line over the first active layer via a second gate insulating film extending in parallel, to cross the first and second active layers;
    a data line, a current driving line and a reference voltage line extending in a direction crossing the gate line, arranged over the gate line and the sensing line via a second interlayer insulating film while, wherein the data line is connected to one end of the first active layer, the current driving line and the reference voltage line are connected to opposite ends of the second active layer, respectively; and
    a switching electrode pattern and a driving electrode pattern arranged on a second interlayer insulating film,
    wherein the switching electrode pattern and the driving electrode pattern are disposed on the same layer as the data line, the switching electrode pattern is connected to the other end of the first active layer, and the driving electrode pattern is connected to a portion of the storage electrode protruding from the driving gate electrode.

2. The organic light emitting display device according to claim 1, further comprising:
    an auxiliary driving gate electrode arranged on the second gate insulating film overlapping the driving gate electrode, wherein the auxiliary driving gate electrode is connected to the switching electrode pattern.

3. A method for manufacturing an organic light emitting display device, comprising:
    preparing a substrate having a plurality of pixels in a matrix;
    forming a storage electrode at each of the pixels on the substrate;
    forming a driving gate electrode over the storage electrode via a first interlayer insulating film such that the driving gate electrode overlaps the storage electrode, to define a storage capacitor;
    forming first and second active layers over the driving gate electrode via a gate insulating film such that the first and second active layers are spaced apart from each other while overlapping the driving gate electrode and the storage electrode, respectively;
    forming a gate line and a sensing line over the first active layer via a second gate insulating film such that the gate line and the sensing line extend in parallel, to cross the first and second active layers; and
    forming a data line, a current driving line and a reference voltage line over the gate line and the sensing line via a second interlayer insulating film such that the data line, the current driving line and the reference voltage line extend in a direction crossing the gate line, the data line is connected to one end of the first active layer, and the current driving line and the reference voltage line are connected to opposite ends of the second active layer, respectively, and forming a switching electrode pattern and a driving electrode pattern in the same layer as the data line on a second interlayer insulating film,
    wherein the switching electrode pattern is connected to the other end of the first active layer, and the driving electrode pattern is connected to a portion of the storage electrode protruding from the driving gate electrode.

* * * * *